(12) United States Patent
Lima Sarabanda et al.

(10) Patent No.: US 9,212,696 B2
(45) Date of Patent: Dec. 15, 2015

(54) BEARING FOR AN INTERNAL COMBUSTION ENGINE

(71) Applicants: Mahle Metal Leve S/A, Jundiai-Sp (BR); Mahle International GmbH, Stuttgart (DE)

(72) Inventors: Valentim Jose Lima Sarabanda, Sao Paulo (BR); Mario Sergio Da Silva Praca, Jundiai (BR); Matheus Dos Santos Ferreira, Jundiai (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 0 days.

(21) Appl. No.: 14/407,570

(22) PCT Filed: Jun. 12, 2013

(86) PCT No.: PCT/BR2013/000208
§ 371 (c)(1),
(2) Date: Dec. 12, 2014

(87) PCT Pub. No.: WO2013/185197
PCT Pub. Date: Dec. 19, 2013

(65) Prior Publication Data
US 2015/0139579 A1 May 21, 2015

(51) Int. Cl.
*F16C 33/20* (2006.01)
*C23C 14/02* (2006.01)
*C23C 14/16* (2006.01)
*C23C 14/58* (2006.01)
*C23C 28/00* (2006.01)

(52) U.S. Cl.
CPC ............. *F16C 33/206* (2013.01); *C23C 14/025* (2013.01); *C23C 14/16* (2013.01); *C23C 14/165* (2013.01); *C23C 14/584* (2013.01); *C23C 28/00* (2013.01); *C23C 28/30* (2013.01); *F16C 33/201* (2013.01); *F16C 33/203* (2013.01); *F16C 2326/01* (2013.01)

(58) Field of Classification Search
CPC ......... F16C 33/20; C23C 28/00; C23C 14/02; C23C 14/16; C23C 14/58
See application file for complete search history.

(56) References Cited

U.S. PATENT DOCUMENTS

| 7,541,086 B2 | 6/2009 | Gartner et al. | |
| 2011/0162685 A1* | 7/2011 | Weiden et al. | 136/244 |
| 2013/0183488 A1* | 7/2013 | Liao et al. | 428/141 |

FOREIGN PATENT DOCUMENTS

| EP | 2592290 A1 | 5/2013 |
| GB | 2465852 A | 6/2010 |

* cited by examiner

*Primary Examiner* — Thomas R. Hannon
(74) *Attorney, Agent, or Firm* — Fishman Stewart Yamaguchi PLLC

(57) ABSTRACT

A bearing for an internal combustion engine may include a ferrous base material onto which a primary layer of a bronze alloy is disposed and a deposited layer applied over the primary layer. A bonding layer may be applied onto the primary layer between the primary layer and the deposited layer. The bonding layer may include nickel and chrome, and the deposited layer may include a metal alloy composed of aluminum and tin. A sliding layer may be disposed on the deposited layer and include a polymeric polyamide-imide matrix provided with a soft metal and at least one of a fluoropolymer and a silane-based material. The ferrous base material, the primary layer, the bonding layer, the deposited layer and the sliding layer in combination may be capable of standing a gripping load higher than 85 MPa.

20 Claims, 2 Drawing Sheets

BEARING FOR AN INTERNAL COMBUSTION ENGINE

CROSS-REFERENCE TO RELATED APPLICATIONS

This application claims priority to Brazilian Patent Application No. 10 2012 014337-2, filed Jun. 13, 2012, and International Patent Application No. PCT/BR2013/000208, filed Jun. 12, 2013, both of which are hereby incorporated by reference in their entirety.

TECHNICAL FIELD

The present invention relates to a bearing for internal combustion engines, which is provided with a polymeric sliding layer with a view to increase its longevity when in work under high pressures and low-lubrication conditions.

BACKGROUND

The present invention relates to a bearing comprising a polymer, wherein the ferrous base material is coated with a layer of bronze alloy, on which a layer is deposited by sputtering, which in turn receives a polymeric sliding layer provided, among other elements, with a soft metal alloy, wherein the primary layer and the sputtered layer can be associated by means of a bonding layer.

Taking into account the growing demands of the automobile industry, especially as far as environmental questions are concerned, new requirements have arisen, which are reflected directly on the components of internal combustion engines. Some of the pieces that naturally undergo this effect are bearings and, as a result, bronze bearings.

Numerous developments have emerged with a view to improve corrosion resistance, friction coefficient and anti-gripping properties. On the other hand, the increase in work pressures of internal combustion engines make it difficult to succeed in such attempts by causing the bearings to wear early. It should be noted that the future does not hold in store any ease for this field of actuation; suffice it to observe that more powerful are required, which can reach higher rotation regimes, are more efficient and consume less fuel.

Naturally, in the face of the new demands, new materials will be necessary, since the known ones are the same that limit the performance of internal combustion engines today.

In addition, due to the growing demands on internal combustion engines, one has used lubricating oils having reduced viscosity with a view to reduce friction. This represents a particularly serious problem for bearings on an internal combustion engine, because at high speeds the oil layer around the bearing undergoes a thinning phenomenon, causing greater contact between metallic elements, which leads to a premature wear of the bearing.

With a view to try and solve the problems indicated, one has developed multiple-layer bronze bearings. The construction in layers usually comprises a resistant base material such as steel coated with a soft-metal alloy and at least one sliding layer, which will keep contact with the film of lubricating oil. These layers are generally applied by means of a coating of rolling material first adhered to the support and at least one additional layer of a rolling material adhered to the surface of the rolling material in the first place. The outer surface of the latter rolling material forms the real sliding surface that interacts with the axle.

It is relevant to note that the importance of the layers is not limited exclusively to the sliding layer. Instead, the function of the layers is found through interaction between them, each having a specific role in the performance of the bearing, as well as a function with regard to the adjacent layer. Moreover, as a rule, bearings are provided with more than one layer for the sake of longevity thereof. Thus, when a sliding layer is worn, another layer will come in contact with the oil film from then on, acting as a sliding layer or wear layer. In these circumstances, the layer applied onto the base material (primary layer) has the objective of providing resistance to gripping and actuating with reasonable performance as a sliding layer too.

Typically, the primary layer has inferior performance in both adapting minor offsetting between the bearing surface and the axle surface, and in capability of adapting countering the particles present in the oil film that would cause scratches or wear of the surfaces.

In view of this concern, one has proposed solutions constituted by a number of layers, each having a defined function for improving the tribologic output, in with a view to prevent the problems mentioned before.

One of these solutions can be exemplified with the deposition of aluminum and tin by the sputtering process onto a primary layer of material of the bearing. Such bearings have, as the main characteristic, the advantage of standing high loads. Anyway, the drawback is that the layer deposited has low sensitiveness to great variations or discontinuities in the oil film, resulting in potential degradation of the bearing and impairing the performance in the long run, thus impairing the functioning of the engine or even leading to failure thereof.

Patent application GB2465852 describes a polymeric sliding layer with a view to improve the performance of a bearing for use on an engine that operates under heavy-duty conditions. The polymeric layer described contains additives that reduce friction, being constituted by a matrix containing 5% to 15% by volume of metallic powder, preferably chosen from the group consisting of aluminum, copper, silver, tungsten and stainless steel; 1% to 15% by volume of fluoropolymer, preferably PTFE or FEP, the balance being a polyamide-imide resin.

It should be noted that the great characteristic of this polymeric sliding layer is that it does not undergo wear and remains on the bushing throughout the useful life thereof, providing it with a load capacity higher than that of conventional bushings. Such an effect generally has superior performance when the aluminum powder is used. Anyway, the bearing disclosed by this British document exhibits a disadvantage. The absence of a layer deposited by the sputtering process reduces the load capacity of the bearing. If this disadvantage is coupled to the growing demand for more charged internal combustion engines, then the application of this bearing will certainly be limited.

Another bearing known from the prior art is described in U.S. Pat. No. 7,541,086. Unlike the above-cited document, the presently disclosed bearing has a constructive configuration provided with a layer deposited by the sputtering process. The mere existence of this deposited layer already indicates that the bearing has higher load capacity and resistance to wear. Anyway, the novelty of this document does not lie in this fact, since bearings provide with layers deposited by the sputtering process are already known since long ago.

Thus, the bearing presented by this patent rests on a fundamental point. The creation of a sliding polymeric layer applied onto the deposited layer. It should be noted, however, that this polymeric sliding layer has nothing to do with the polymeric sliding layer of document GB 2465852, since this is a polymeric sacrifice layer provided with molybdenum disulfate which, as it is known, is an excellent lubricant.

However, the chemical configuration of the polymer was not designed so that it will last throughout the useful life of the bearing. Instead, the objective is that this polymeric layer will wear during the first hours of operation, so that the molybdenum disulfate will be released from the polymer to be impregnated in the deposited layer.

As a result, after a few hours of operation, the bearing described in this document has a constructive configuration equivalent to that of the prior art, that is, it behaves as a bearing whose main element that exhibits performance in its durability is the sputtered sliding layer. Consequently, this bearing cannot guarantee high load capacity, although it exhibits good resistance to gripping.

These two documents synthesize the great difficulty of obtaining a bearing capable of providing a balance point between resistance to gripping and high load capacity. Naturally, these characteristics have always been sought, but not yet materialized, even in the present applications, let alone in future demands which the automotive industry has been stating to be fundamental so vehemently.

A reason for this lies in the limit values usually encountered by prior-art bearings. In this regard, one should note that the value of load capacity of a bearing provided with a sputtered sliding layer usually ranges from 100 MPa to 120 MPa, the usual gripping load ranging from 50 MPa to 60 MPa. In an attempt to improve the resistance to gripping, bimetallic bearings with polymer may achieve values on the order of 85 MPa to 90 MPa. Anyway, the usual load capacity is of about 70 MPa to 80 MPa. Such values demonstrate clearly the difficulty in achieving an improvement of one of the properties, without there being a significant impairment of the other.

Naturally, harmonizing technologies is something possible, but often made unfeasible by the high cost of development and industrial production. In this regard, one has always tried to achieve more durable bearings by merely modifying the layers, rather than combining layers.

Thus, it is necessary to find a bearing that manages to combine the characteristics responsible for the durability of the bearing, so that the latter will have a load capacity value equal to or higher than 120 MPa and a value for the gripping load higher than 85 MPa.

SUMMARY

Therefore, it is an objective of the present invention to provide a bearing capable of combining different characteristics responsible for the durability of the bearing, so as to obtain concomitantly an increase in the load capacity value and in the gripping resistance value.

It is also an objective of the invention to provide a bearing comprising at least one sputtered layer that receives a sliding polymeric layer, wherein the polymeric coating will be kept operational throughout the useful life of the bearing.

It is a further objective of the invention to provide a bearing comprising at least one sputtered layer provided with a polymeric coating, the polymeric sliding layer being constituted by a soft metal alloy, among other elements.

The objectives of the present invention are achieved by means of a bearing for internal combustion engines, the bearing being provided with a ferrous base material onto which the one applies, sequentially, a primary layer of bronze alloy and a deposited layer, and onto the deposited layer one applies a sliding layer comprising a polymeric polyamide-imide matrix provided with a soft metal, a fluoropolymer and a silane-based material, the bearing being capable of standing a gripping load higher than 85 MPa.

BRIEF DESCRIPTION OF THE DRAWINGS

The present invention will now be described in greater detail with reference to an example of embodiment represented in the drawings. The figures show.

DETAILED DESCRIPTION

Figure 1:
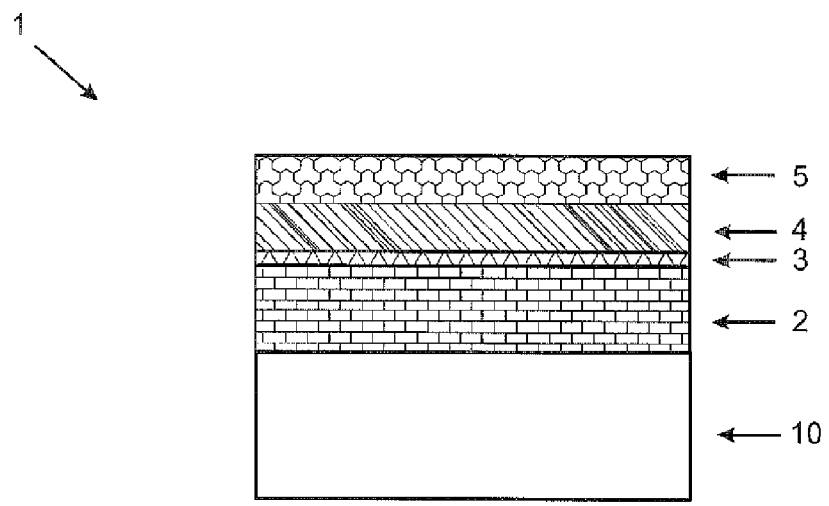
FIG. 1 is representation of the layers of the bearing of the present invention.
Figure 2:
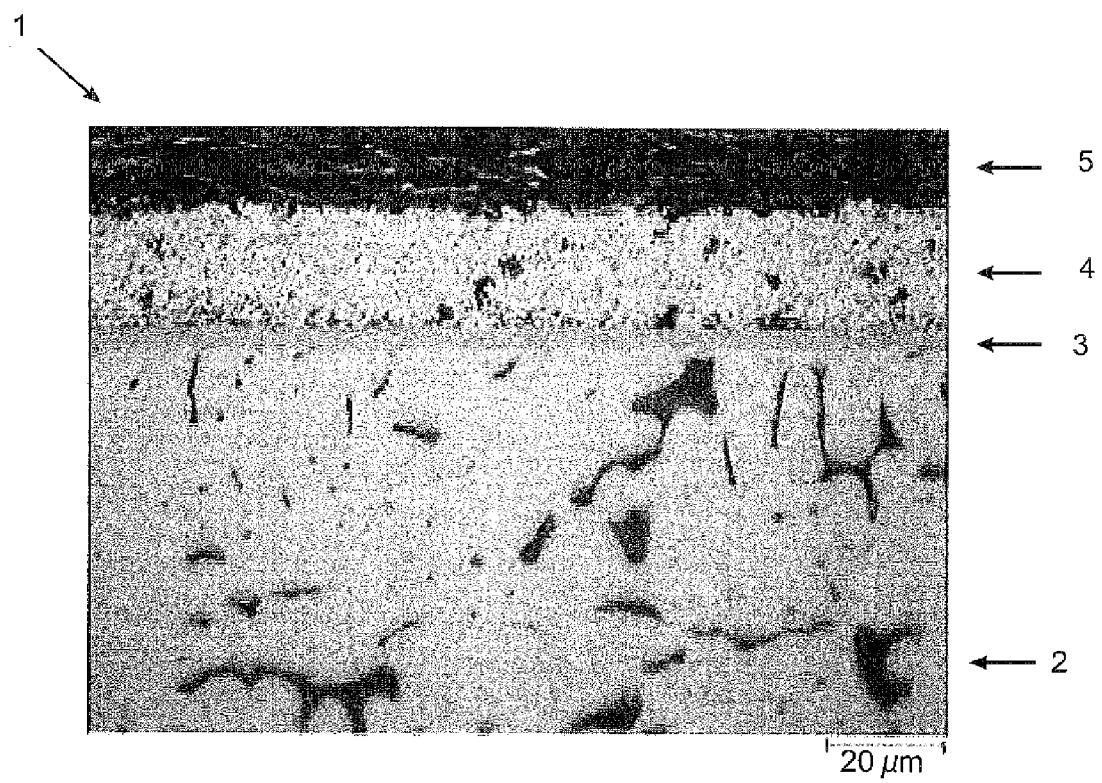
FIG. 2 is a photograph of the layers of the bearing of the present invention.

FIGS. 1 and 2 show a cross-sectional view of a bearing of the present invention. Preferably, but not compulsorily, the bearing 1 of the present invention comprises a ferrous base material 10, onto which one applies a primary layer 2 of a bronze alloy. The primary layer 2 further receives a layer 4 deposited by sputtering, which in turn receives a sliding layer 5 comprising a polymeric polyamide-imide matrix containing a soft metal, a fluoropolymer and a silane-based material. In an alternative configuration, which is equivalent to the representation of FIG. 1, the bearing 1 is provided with a bonding layer 3, which is applied onto the primary layer 2, the bonding layer 3 has the main objective of providing better association between the primary layer 2 and the deposited layer 4.

With reference to the particularities of the bearing 1 of the present invention, it should be noted that the base material 10 comprises a ferrous alloy, preferably made of low-carbon or middle-carbon steel with thick-ness ranging from 1 mm to 5 mm.

With regard to the primary layer 2, its composition is preferably of 4%-8% tin, 1%-4% bismuth, 1%-3% nickel, the balance being copper. The copper alloy has a thickness ranging from 150 to 400 micrometer. It should be noted that the primary layer 2 may or may not contain lead.

The bonding layer 3, which provides improved association be-tween the primary layer 2 and the deposited layer 4, comprises nickel and chrome, its thickness ranging from 1 to 5 micrometer.

The deposited layer 4, deposited by sputtering, comprises 1%-40% tin, 1% silicon, 1% copper, 2% iron, the balance being aluminum. The thickness of the deposited layer 4 ranges from 3 to 20 micrometer.

As disclosed before, the invention relates to the deposition of this polymeric sliding layer 5 onto a layer 4 deposited by sputtering. More specifically, the polymeric sliding layer 5 comprises a polymeric polyamide-imide matrix provided with a soft metal, a fluoropolymer and a silane-based material.

Preferably, the sliding layer 5 has a concentration of 1-14% by volume of soft metal (in the form of a powder or flakes), more preferably from 11 to 14%, with an ideal concentration of 12.5%. The soft metal may be chosen from aluminum, copper, silver, tungsten alloys and inox.

In a preferred embodiment of the invention, the sliding layer comprises an aluminum powder with particle size lower than 5 micrometer. The shape of the metal may be machined so that it will result in a maximum area, better orientation of the soft metal in the polymeric matrix and, as a result, better performance as to the absorption of particles present in the thin oil film.

Preferably, the sliding layer 5 has a concentration ranging from 2 to 8% by volume of fluoropolymer. This fluoropolymer may be chosen from polytetrafluoroethylene and fluorinated ethylene-propylene, preferably the fluoropolymer of the sliding layer 5 is polytetrafluoroethylene (PTFE), the amount of which is of 5.7%. It should be noted that the use of this fluoropolymer reduces the friction coefficient of the bearing and improves the lubricating properties thereof.

The polymeric matrix that consists of the sliding layer 5 also contains a silane material. These materials promote stability of the matrix and promote adhesion of the material to the layer 4 deposited by sputtering. The silane material may be chosen from gamma-aminopropyltriethoxysylane or bis-(gamma-trimethoxysylylpropyl) amine, preferably the silane material is of gamma-aminopropyltriethoxysylane. The sliding layer preferably has a concentration ranging from 3 to 6% by volume of a material or a mixture of silane materials, preferably 4.8%.

The polymeric matrix of the sliding layer 5 further comprises an amount lower than 0.1% of other elements, the balance being of polyamide-imide, which usually will result in an amount of 77%.

Finally, the thickness of the sliding layer 5 ranges from 5 to 20 micrometer, preferably from 7 to 20 micrometer.

In short, the new concept of the present invention undergoes the combined association of a layer 4 deposited by sputtering with a sliding layer 5 of polymeric matrix. The invention was to join the best properties of each solution. On the one hand, it would be reasonable to think that the deposited layer 4 would guarantee good resistance to wear and good load capacity and, on the other hand, that the polymeric sliding layer 5 provides good resistance to gripping. Thus, it is to be expected that, in the best of hypothesis, one would achieve a combination of the values found in the prior art, that is, achieve a bearing 1 with a load capacity equal to 120 MPa and a value for the gripping load equal to or higher than 85 MPa.

Surprisingly, the novel combination has exceeded the expected results, having achieved values of up to 150 MPa for the load capacity and of 90 MPa for the gripping load, these values being markedly higher than the mere expectation when one analyzes the results of the prior art.

Thus, the constructive configuration of the present invention has exceeded the initial expectation, fully justifying the novel bearing 1 as far as the cost is concerned. In other words, it is understandable to state that the cost of a bearing 1 of the present invention is higher than that of bearings that use only a part of their layers. Thus, at a first moment, one might expect that the bearing 1 of the present invention would be commercially unfeasible. However, the excellent tribologic results achieved guarantee greater longevity to the internal combustion engine than normal, including the most modern engines, the stresses of which are considerably higher. Thus, the result achieved by the bearing 1 of the present invention is as high as those of the prior art, which one predicts as being a commercial success because it pushes an engine beyond the present-day limits and for a longer time, even in conditions of poor lubrication.

Such novel and unexpected effects are probably due to a novel mechanism and a novel function on which the addition of soft metal flakes or powders in the polymeric matrix of the sliding layer 5 has a special impact.

The prior art, namely Miba patent, specifies clearly that one should not use soft metals in the polymeric layer, because the latter, upon decomposing, would cause the transfer of these thin metal particulate to the oil and, as a result, a potential risk for the bearing, that is, an early wear. The principle of the present invention has a distinct criterion when requiring the presence of a soft metal in the composition of the polymeric sliding layer 5.

One understands that the function of the soft metal flakes or powders inserted into the sliding layer 5, considering that the polymeric layer remains associated to the bearing throughout the useful life of the latter, has a protective effect on the engine. Such a metal, as for example, aluminum, facilitate the absorption of the residual particles present in the lubricating oil, preventing the latter from causing damages to the engine.

In cases of disturbance located in the bearing, resulting from a high load and high velocity, the impact may go beyond the polymeric sliding layer 5. In this regard, the constructive configuration of the bearing 1 of the present invention works to the effect that the deposited layer 4 will be capable of absorbing a part of these harmful impacts. Such an effect comes from the fact that its chemical composition is also provided by soft metals. Thus, the deposited layer and sliding layer 5 work in conjunction, providing higher difficulty for the bearing 1 to wear.

It is this dynamics between the two layers 4, 5 that results in a bearing with higher resistance to gripping and with high load capacity. In this regard, the bearing 1 described now was the object of various examinations to evaluate its performance on an internal combustion engine, and it has become clear that this bearing reduces friction and improves resistance to scraping throughout the useful life of the bearing.

The results achieved enable one to establish a value that considers the relationship between the hard characteristics (load capacity) and the soft characteristics (resistance to gripping). Considering that both indices use, as megapascal units (MPa), it is possible to determine an index of the material (IM) that will correspond to the sum of the hard characteristics (IH) and the soft characteristics (IS), which would result in the following relationship: IM=IH+IS.

The table below presents a comparison of the index of material (IM) of bearings of the prior art with the bearing 1 of the present invention.

TABLE 1

| Characteristics of the metal | IH (MPa) | IS (MPa) | IM (MPa) |
|---|---|---|---|
| Bi metallic AlSnSi with polymer (GB 2465852) | 80 | 80 | 170 |
| Sputtering AlSn (U.S. Pat. No. 7,541,086) | 120 | 50 | 170 |
| Sputtering AlSn AlSn with polymer | 150 | 90 | 240 |

As can be seen in the above table, the bearing 1 of the present invention has achieved an index of material of more than 40% superior to the best values of the prior art, thus evidencing it notable advantage.

Figure 4:
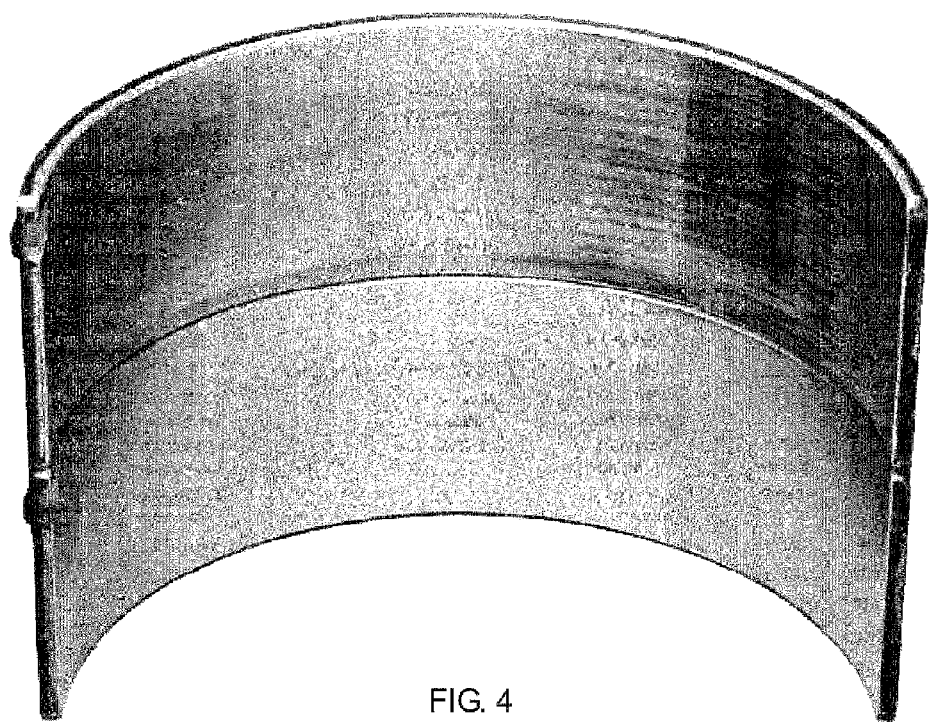
FIG. 4 is a comparative photograph comparing the bearing of the prior art with that of the present invention, after a 1000-hour engine test.

The images of FIG. 4 show that optimum results were achieved in an examination of 1000 hours, and it is observed that the upper bearing of FIG. 4 represents the bearing of the prior art and the lower bearing represents the present invention. What is most impressive is that the bearing 1 of the present invention does not exhibit any scoring, thus evidencing its notable superiority.

This examination was carried out by using a heavy-duty diesel engine. The capacity load applied was of 85 MPa.

Figure 3:
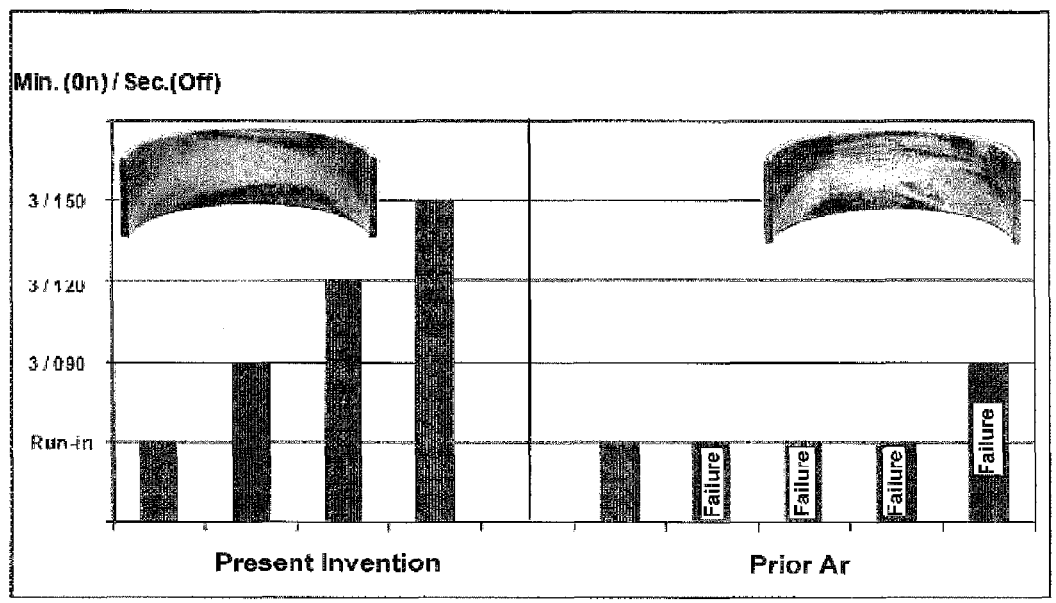
FIG. 3 is a comparative graph comparing the bearing of the prior art with that of the present invention.

In turn, FIG. 3 represents a test carried out between a bearing of the present invention and another of the prior art.

This examination was carried on a bench test, where the test oil was turned on and off to evaluate the performance of the bearing in resisting scraping under conditions of minimum lubrication. The examination was carried out in the following steps:

1) engine of the bench test turned on for 15 minutes with adequate lubrication;
2) adequate lubrication for 3 minutes, after supplying oil and cut in 90 seconds;
3) adequate lubrication for 3 minutes, after supplying oil and cut in 150 seconds.

The bearing 1 disclosed now in this invention has gone through other steps, without any scraping of the bearing occurring. A bearing of the prior art failed in four of the five tests, wherein three of the failures occurred right in the first step. Naturally, this is a considerable difference, to say the least.

Thus, the advantage of the bearing 1 of the present invention is clear, wherein the combination of the chemical elements, arranged in such a specific constructive configuration have given way to excellent results, which were not achieved before.

A preferred example of embodiment having been given, one should understand that the scope of the present invention embraces other possible variations, being limited only by the contents of the accompanying claims, which include the possible equivalents.

The invention claimed is:

1. A bearing for an internal combustion engine, comprising: a ferrous base material onto which a primary layer of a bronze alloy is disposed and a deposited layer applied over the primary layer, a bonding layer applied onto the primary layer between the primary layer and the deposited layer, the bonding layer promoting the association between the primary layer and the deposited layer, the bonding layer including nickel and chrome and the deposited layer including a metal alloy composed of aluminum and tin, and a sliding layer disposed on the deposited layer and including a polymeric polyamide-imide matrix provided with a soft metal and at least one of a fluoropolymer and a silane-based material, wherein the soft metal includes at least one of aluminum, copper, silver, tungsten alloys and inox, wherein the ferrous base material, the primary layer, the bonding layer, the deposited layer and the sliding layer in combination are capable of standing a gripping load higher than 85 MPa.

2. The bearing according to 1, wherein the deposited layer is deposited by sputtering.

3. The bearing according to claim 1, wherein the sliding layer includes a concentration from 1% to 15% by weight of the soft metal.

4. The bearing according to claim 1, wherein the sliding layer includes a concentration of 12.5% by volume of the soft metal.

5. The bearing according to claim 1, wherein the soft metal of the sliding layer is aluminum composed of at least one of flakes and powder.

6. The bearing according to claim 1, wherein the sliding layer includes the fluoropolymer in a concentration from 2% to 8% by volume.

7. The bearing according to claim 1, wherein the fluoropolymer is of a polytetrafluorethylene (PTFE) type.

8. The bearing according to claim 1, wherein the sliding layer includes the silane-based material in a concentration from 3% to 6% by volume.

9. The bearing according to claim 1, wherein the ferrous base material is composed of at least one of a low-carbon steel and a middle-carbon steel.

10. The bearing according to claim 1, wherein the deposited layer includes a concentration of 1%-40% tin, 1% silicon, 1% copper, 2% iron, and a balance composed of aluminum.

11. The bearing according to claim 1, wherein the deposited layer has a thickness ranging from 3 to 20 micrometer.

12. The bearing according to claim 1, wherein the sliding layer has a thickness ranging from 5 to 20 micrometer.

13. The bearing according to claim 1, wherein the deposited layer has a thickness ranging from 5 to 20 micrometer.

14. The bearing according to claim 1, wherein the bonding layer has a thickness ranging from 1 to 5 micrometer.

15. The bearing according to claim 1, wherein the sliding layer remains functionally associated to the deposited layer throughout a useful life of the bearing.

16. The bearing according to claim 1, wherein the ferrous base material, the primary layer, the bonding layer, the deposited layer and the sliding layer in combination includes a load capacity ranging from 120 MPa to 150 MPa.

17. The bearing according to claim 16, wherein the load capacity ranges from 140 MPa to 150 MPa.

18. The bearing according to claim 1, wherein the ferrous base material, the primary layer, the bonding layer, the deposited layer and the sliding layer in combination stands a gripping load ranging from 85 MPa to 90 MPa.

19. The bearing according to claim 1, wherein the sliding layer has a thickness ranging from 7 to 20 micrometer.

20. A bearing for an internal combustion engine, comprising:
a multilayered sliding surface including:
    a ferrous base material;
    a primary layer composed of a bronze alloy disposed on the ferrous base material;
    a bonding layer disposed between the primary layer and a sputter deposited layer, the bonding layer being composed of nickel and chrome, wherein the sputter deposited layer includes a metal alloy composed of aluminum and tin;
    a sliding layer disposed on the sputter deposited layer and including a polymeric polyamide-imide matrix containing a soft metal, a fluoropolymer and a silane-based material, the soft metal including at least one of aluminum, copper, silver, tungsten alloys and inox;
    wherein the sliding layer includes a concentration of soft metal from 11% to 14% by volume and a concentration of fluoropolymer from 2% to 8% by volume; and
wherein the multilayered sliding surface stands a gripping load greater than 85 MPa and a load capacity ranging from 120 MPa to 150 MPa.

* * * * *